US010340924B1

United States Patent
Chen

(10) Patent No.: US 10,340,924 B1
(45) Date of Patent: Jul. 2, 2019

(54) PHASE-LOCKED CIRCUIT WITH AUTOMATIC CALIBRATION FUNCTION AND AUTOMATIC CALIBRATION METHOD THEREOF

(71) Applicant: ANPEC ELECTRONICS CORPORATION, Hsinchu (TW)

(72) Inventor: Jing-Min Chen, Hsinchu (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 16/132,566

(22) Filed: Sep. 17, 2018

(30) Foreign Application Priority Data

May 25, 2018 (TW) .............................. 107117947 A

(51) Int. Cl.
*H03L 7/085* (2006.01)
*H03L 7/099* (2006.01)

(52) U.S. Cl.
CPC ............ *H03L 7/085* (2013.01); *H03L 7/0992* (2013.01)

(58) Field of Classification Search
CPC ......... H03L 7/093; H03L 7/091; H03L 7/099; H03L 7/0992; H03L 7/085; H03L 7/087; H03L 7/10; H03L 7/16; H03L 7/06
USPC ......... 327/156, 158, 161; 375/371, 374, 375
See application file for complete search history.

(56) References Cited

U.S. PATENT DOCUMENTS

| | | | | |
|---|---|---|---|---|
| 2005/0226357 A1* | 10/2005 | Yoshimura | .............. | H03L 7/099 375/376 |
| 2005/0258906 A1* | 11/2005 | Su | ........................... | H03L 7/099 331/10 |
| 2012/0019294 A1* | 1/2012 | Cheng | ..................... | H03L 7/085 327/157 |
| 2013/0082754 A1* | 4/2013 | Chern | ..................... | H03L 7/099 327/157 |
| 2013/0278303 A1* | 10/2013 | Chen | ...................... | H03L 7/101 327/117 |
| 2014/0327477 A1* | 11/2014 | Chiang | ..................... | H03L 7/08 327/156 |
| 2016/0126964 A1* | 5/2016 | Huang | ................ | G06F 13/4282 710/105 |

* cited by examiner

*Primary Examiner* — John W Poos
(74) *Attorney, Agent, or Firm* — Li & Cai Intellectual Property (USA) Office

(57) ABSTRACT

A digital phase-locked loop with an automatic calibration function and an automatic calibration method thereof are provided. The digital phase-locked loop includes a frequency and phase detector, a calibration circuit, a frequency and phase locked circuit, and an oscillator circuit. The frequency and phase locked circuit outputs an initial control signal. The calibration circuit calibrates an initial frequency and outputs an initial calibration signal having a calibrated initial frequency when determining that the initial frequency does not fall within an allowable error calibration range. The frequency and phase locked circuit locks the calibrated initial frequency when determining that the calibrated initial frequency falls within a locked frequency range. The oscillator circuit outputs an oscillator signal according to the initial calibration signal and the initial control signal. Therefore, a resolution of the oscillator circuit can be improved by the automatic calibration of frequency drift caused by processes and environments.

12 Claims, 7 Drawing Sheets

PHASE-LOCKED CIRCUIT WITH AUTOMATIC CALIBRATION FUNCTION AND AUTOMATIC CALIBRATION METHOD THEREOF

CROSS-REFERENCE TO RELATED PATENT APPLICATION

This application claims the benefit of priority to Taiwan Patent Application No. 107117947, filed on May 25, 2018. The entire content of the above identified application is incorporated herein by reference.

FIELD OF THE DISCLOSURE

The present disclosure involves a digital phase-locked loop, and more particularly to a digital phase-locked loop with an automatic calibration function and an automatic calibration method thereof.

BACKGROUND OF THE DISCLOSURE

With the advancement of electronic technology, electronic products have become an indispensable part of people's daily lives. The electronic products such as communication products allow interactive information exchange between people every day. Most common among electronic communication products is the phase-locked circuit device. However, various factors such as temperature in the process and in the environment may cause an oscillator circuit to generate frequency drift. The conventional phase-locked circuit does not have an automatic calibration function, so that it cannot calibrate the frequency drift. In order to solve the above frequency drift problem, it is necessary to set a frequency range and perform frequency calibration by using an additional machine in the process. Even if a higher resolution is required the number of control bits would need to be increased, resulting in a higher cost. The conventional phase-locked circuit is inconvenient to be used and has poor calibration efficiency.

SUMMARY OF THE DISCLOSURE

An object of the present disclosure is to provide a digital phase-locked loop with an automatic calibration function for solving the above problem. The digital phase-locked loop with the automatic calibration function includes a frequency and phase locked circuit, a calibration circuit, an oscillator circuit, a divider and a frequency and phase detector.

The frequency and phase locked circuit is configured to receive a calibration control signal from an external electronic device and output a corresponding initial control signal. The frequency and phase locked circuit is configured to track a calibrated initial frequency and an initial phase of an initial calibration signal. The frequency and phase locked circuit is configured to lock the calibrated initial frequency and the initial phase when the calibrated initial frequency falls within the locked calibration frequency range and the initial phase falls within a locked phase range. The frequency and phase locked circuit is configured to lock a divided frequency and a divided phase of a divided signal when determining that the divided frequency falls within a locked frequency range and the divided phase falls within the locked phase range. The calibration circuit is connected to the frequency and phase locked circuit. The calibration circuit is configured to store an allowable calibration error range. The calibration circuit is configured to calibrate the initial frequency to generate the calibrated initial frequency and output the initial calibration signal having the calibrated initial frequency when determining that an initial frequency of the initial control signal does not fall within the allowable calibration error range. The oscillator circuit is connected to the calibration circuit and the frequency and phase locked circuit. The oscillator circuit is configured to output an oscillator signal according to the initial calibration signal and the initial control signal. The divider is connected to the oscillator circuit and configured to receive a divisor instructing signal indicating a preset divisor value from an external electronic device. The divider is configured to divide an oscillation frequency of the oscillator signal by the preset divisor value to generate the divided signal. The preset divisor value is associated with a ratio of a reference frequency and the oscillating frequency. The frequency and phase detector is connected to the divider. The frequency and phase detector is configured to detect a frequency difference between the divided frequency and the reference frequency and a phase difference between the divided phase and a reference phase. The frequency and phase detector is configured to output the frequency difference and the phase difference to the frequency and phase locked circuit as a basis for determining that the divided frequency falls within the locked frequency range and the divided phase falls within the locked phase range.

Furthermore, the present disclosure provides an automatic calibration method for a digital phase-locked loop with automatic calibration function, including the following steps: (a) outputting an initial control signal from a frequency and phase locked circuit; (b) calibrating an initial frequency to generate an calibrated initial frequency and outputting an initial calibration signal having the calibrated initial frequency by a calibration circuit when determining that the initial frequency of the initial control signal does not fall within an allowable calibration error range by the calibration circuit; (c) tracking whether the calibrated initial frequency falls within a locked calibration frequency range or not by the frequency and phase locked circuit; when the calibrated initial frequency does not fall within the locked calibration frequency range, performing step (b); when the calibrated initial frequency falls within the locked calibration frequency range, locking the calibrated initial frequency by the frequency and phase locked circuit and then performing step (d); (d) outputting an oscillator signal according to the initial calibration signal and the initial control signal by an oscillator circuit; (e) dividing an oscillation frequency of the oscillator signal by a preset divisor value to generate a divided signal by a divider; (f) detecting a frequency difference between a divided frequency of the divided signal and a reference frequency, and a phase difference between a divided phase of the divided signal and a reference phase by the frequency and phase detector; (g) tracking whether the divided frequency falls within a locked frequency range according to the frequency difference or not by the frequency and phase locked circuit; when the divided frequency does not fall within the locked frequency range, continuing to track the divided frequency; when the divided frequency falls within the locked frequency range, locking the divided frequency by the frequency and phase locked circuit and then performing step (h); (h) tracking whether the divided phase falls within a locked phase range or not according to the phase difference by the frequency and phase locked circuit; when the divided phase does not fall within the locked phase range, continuing to track the divided phase; when the divided phase falls within the locked phase range, locking the divided phase by the frequency and phase locked circuit and then perform step (d).

As mentioned above, the digital phase-locked loop with an automatic calibration function and the automatic calibration method provided by the present application can automatically calibrate the frequency drift without using an additional machine for calibration when the frequency of the output of the oscillator circuit is drifted due to various factors in the process and in the environment, such as when the digital phase-locked loop is activated. Furthermore, as the number of bits of the oscillator circuit is limited, a resolution of the oscillator can be optimized and costs can be effectively saved thereby.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
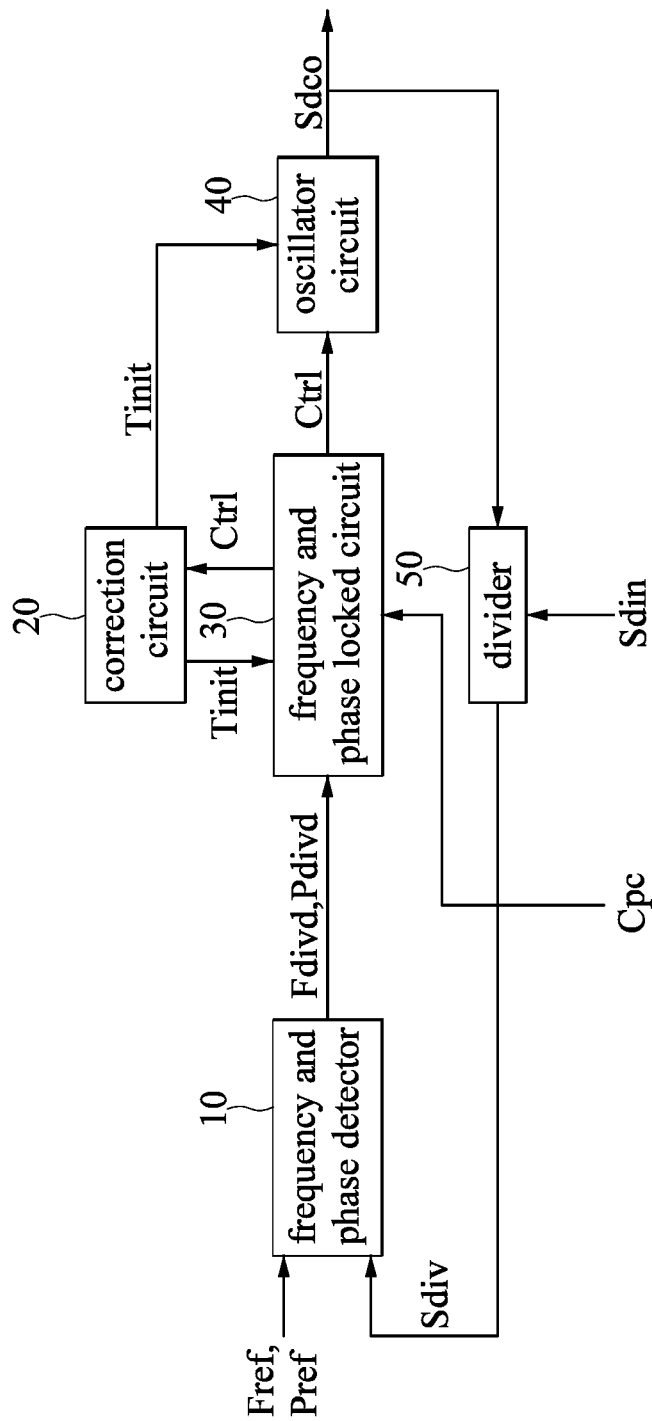
FIG. 1 is a block diagram of a digital phase-locked loop with an automatic calibration function for initial frequency calibration according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, a block diagram of a digital phase-locked loop with an automatic calibration function for initial frequency calibration according to a first embodiment of the present disclosure is shown. As shown in FIG. 1, in the embodiment, the digital phase-locked loop with the automatic calibration function includes a frequency and phase detector 10, a calibration circuit 20, a frequency and phase locked circuit 30, an oscillator circuit 40 and a divider 50. The frequency and phase detector 10 is connected to the calibration circuit 20, the frequency and phase locked circuit 30 and the divider 50. The calibration circuit 20 is connected to the frequency and phase locked circuit 30. The oscillator circuit 40 is connected to the calibration circuit 20, the frequency and phase locked circuit 30 and the divider 50.

First, the frequency and phase locked circuit 30 may receive a calibration control signal Cpc having a preset frequency corresponding to a default code from an external electronic device. The frequency and phase locked circuit 30 may then output an initial control signal Ctrl having an initial frequency according to the calibration control signal Cpc.

The calibration circuit 20 may store an allowable calibration error range corresponding to the above preset frequency. Ideally, when the initial frequency falls within the allowable calibration error range, the calibration circuit 20 does not need to calibrate the initial frequency.

However, it is worth noting that various factors such as temperature in processes and in an environment usually cause frequency drift in the digital phase-locked loop. Therefore, in the embodiment, the calibration circuit 20 is disposed in the digital phase-locked loop for storing the allowable calibration error range. When the initial frequency of the calibration control signal Cpc from the frequency and phase locked circuit 30 drifts too much and does not fall within the allowable calibration error range, the calibration circuit 20 may calibrate the initial frequency of the initial control signal Ctrl from the frequency and phase locked circuit 30 to generate a calibrated initial frequency. The calibration circuit 20 then outputs an initial calibration signal having the calibrated initial frequency. For example, the initial calibration signal Tinit may be represented by logical bits and be outputted to the frequency and phase locked circuit 30.

The calibration control signal Cpc received by the frequency and phase locked circuit 30 from an external electronic device may also indicate a locked calibration frequency range and a locked phase range. When the frequency and phase locked circuit 30 receives the initial calibration signal Tinit from the calibration circuit 20, the frequency and phase locked circuit 30 tracks whether the calibrated initial frequency of the initial calibration signal Tinit falls within the locked calibration frequency range. When the calibrated initial frequency falls within the locked calibration frequency range, the frequency and phase locked circuit 30 locks the calibrated initial frequency. The locked calibration frequency range for the calibrated initial frequency may be greater than or equal to a locked frequency range for a divided frequency described below.

After locking the calibrated initial frequency, the frequency and phase locked circuit 30 may track whether an initial phase of the initial calibration signal Tinit falls within the locked phase range. When the tracked initial phase falls within the locked phase range, the frequency and phase locked circuit 30 locks the initial phase. In the embodiment, only the initial frequency is calibrated and the initial phase is not calibrated, and therefore the initial phase is tracked and locked instead of a calibrated initial phase. It should be understood that, if desired, the initial phase may be calibrated to generate the calibrated initial phase and the calibrated initial phase falling within a locked calibration phase range is tracked and locked.

For example, the oscillator circuit 40 is a digitally controlled oscillator as described in the embodiment. However, different types of oscillators, such as a voltage-controlled oscillator, may be selected according to requirements, and the present disclosure is not limited thereto. The oscillator circuit 40 may output an oscillator signal Sdco according to the initial calibration signal Tinit (and the initial control signal Ctrl of the frequency and phase locked circuit 30). Then, the oscillator signal Sdco may be fed back to the frequency and phase detector 10.

The divider 50 may be an integer divider or a fractional divider for receiving and storing a preset divisor value that is an integer or a fractional value. In the embodiment, the divider 50 is applied to a division operation of the frequency, and thus it may also be referred to as a frequency divider. The divider 50 may receive a divisor instructing signal Sdin from an external electronic device. When the oscillator signal Sdco is transferred to the divider 50 before being fed back to the frequency and phase detector 10 from the oscillator circuit 40, the divider 50 divides an oscillation frequency of the oscillator signal Sdco by the preset divisor value to obtain a divided frequency. The divider 50 then outputs a divided signal Sdiv having the divided frequency to the frequency and phase detector 10.

A high frequency of the oscillator signal Sdco outputted from the oscillator circuit 40 may be lowered to a frequency at which the frequency and phase detector 10 can operate via the above-described frequency division operation. It should be understood that the preset divisor value and the number of times of the division operation is performed may depend on a plurality of reference frequency Fref that is operable by the frequency and phase detector 10 and the oscillation frequency outputted by the oscillator circuit 40.

Further, the frequency and phase detector 10 may receive the reference frequency Fref and a reference phase Pref from an external electronic device. When receiving the divided signal Sdiv from the divider 50, the frequency and phase detector 10 detects a frequency difference Fdivd between the divided frequency of the divided signal Sdiv and the reference frequency Fref and outputs the frequency difference Fdivd to the frequency and phase locked circuit 30. The frequency and phase locked circuit 30 may lock the divided frequency when tracking and determining that the divided frequency falls within the locked frequency range according to the frequency difference Fdivd.

After locking the divided frequency, the frequency and phase detector 10 may detect a phase difference Pdivd between a divided phase of the divided signal Sdiv and the reference phase Pref, and output the phase difference Pdivd to the frequency and phase locked circuit 30. The frequency and phase locked circuit 30 may lock the divided phase when tracking and determining that the divided phase falls within the locked phase range.

Figure 2:
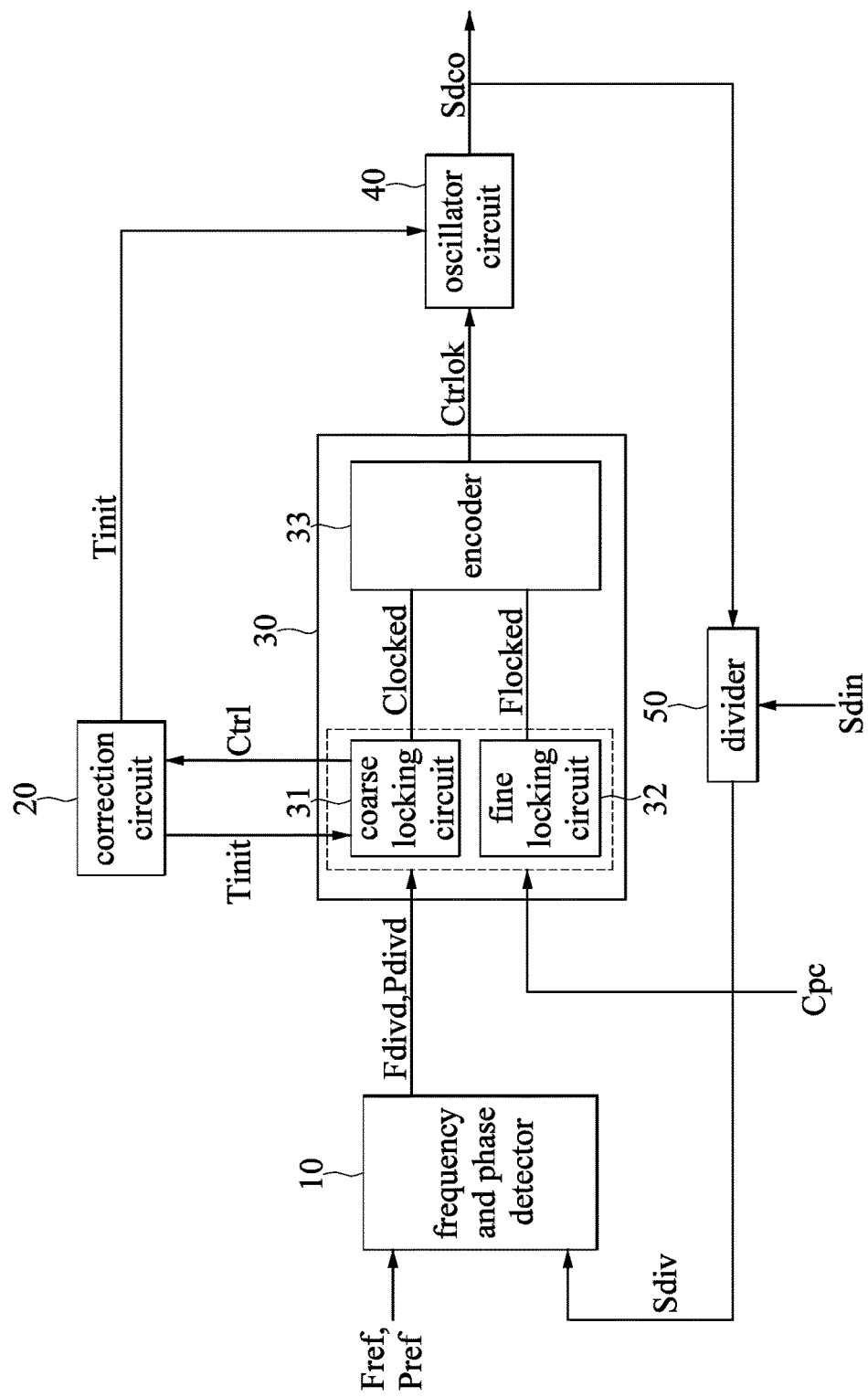
FIG. 2 is a block diagram of a digital phase-locked loop with an automatic calibration function for initial frequency calibration according to a second embodiment of the present disclosure.

Referring to FIG. 2, a block diagram of a digital phase-locked loop with an automatic calibration function for initial frequency calibration according to a second embodiment of the present disclosure is shown. The portions of the second embodiment that are the same as those of the first embodiment are not described again. As shown in FIG. 2, the phase-locked circuit with the automatic calibration function includes the frequency and phase detector 10, the calibration circuit 20, the frequency and phase locked circuit 30, the oscillator circuit 40 and the divider 50. The frequency and phase locked circuit 30 includes a coarse locking circuit 31, a fine locking circuit 32 and an encoder 33. The coarse locking circuit 31 and the fine locking circuit 32 are connected to the frequency and phase detector 10, the calibration circuit 20 and the encoder 33. The encoder 33 is connected to the oscillator circuit 40. The frequency and phase detector 10 and the oscillator circuit 40 are connected to the calibration circuit 20 and the divider 50.

The frequency and phase locked circuit 30 receives the calibration control signal Cpc from an external electronic device. The calibration control signal Cpc may instruct the coarse locking circuit 31 to store a coarse locked frequency range and a coarse locked phase range. The calibration control signal Cpc also may instruct the fine locking circuit 32 to store a fine locked frequency range and a fine locked phase range. For example, an upper range value of the coarse locked frequency range may be a value that is the preset frequency plus 5% of the preset frequency, and a lower range value of the coarse locked frequency range may be a value that is the preset frequency minus5% of the preset frequency. On the other hand, an upper range value of the fine locked frequency range may be a value that is the preset frequency plus 1% of the preset frequency, and a lower range value of the fine locked frequency range may be a value that is the preset frequency minus1% of the preset frequency.

The coarse locking circuit 31 locks the calibrated initial frequency of the initial calibration signal Tinit when tracking and determining that the calibrated initial frequency falls within the coarse locked frequency range. The coarse locking circuit 31 then outputs a coarse locking signal Clocked to the oscillator circuit 40 according to a coarse tracking result. Alternatively the coarse locking circuit 31 outputs the coarse locking signal Clocked to the fine locking circuit 32 to instruct the fine locking circuit 32 to start fine tracking immediately or after a predetermined period of time.

The fine locking circuit 32 performs fine tracking operation on the calibrated initial frequency of the initial calibration signal Tinit. The fine locking circuit 32 locks the calibrated initial frequency falling within the fine locked frequency range, and accordingly outputs a corresponding fine locking signal Flocked to the encoder 33. Further, the encoder 33 may encode the coarse locking signal Clocked and the fine locking signal Flocked to output a corresponding lock control signal Ctrlok.

The oscillator circuit 40 may output the oscillator signal Sdco according to the initial calibration signal Tinit and the lock control signal Ctrlok. The divider 50 performs a frequency division on the oscillator signal Sdco from the oscillator circuit 40 to obtain the divided signal Sdiv to be fed back to the frequency and phase detector 10. The frequency and phase detector 10 detects the frequency difference Fdivd between the divided frequency of the divided signal Sdiv and the reference frequency Fref, and detects the phase difference Pdivd between the divided phase of the divided signal Sdiv and the reference phase Pref.

Similar to the tracking and locking operation of the above-described initial calibration frequency and initial phase, a specific embodiment of the divided frequency and the divided phase of the divided signal Sdiv will be described below.

The coarse locking circuit 31 locks the divided frequency falling within the coarse locked frequency range according to the frequency difference Fdivd. The coarse locking circuit 31 locks the divided phase falling within the coarse locked phase range according to the phase difference Pdivd. When the fine locking circuit 32 receives an indication signal indicating the completion of the coarse tracking from the coarse locking circuit 31 or other circuits, the fine locking circuit 32 may start to track the divided frequency and the divided phase of the divided signal Sdiv. The fine locking circuit 32 locks the tracked divided frequency when tracking and determining that the divided frequency falls within the fine locked frequency range. The fine locking circuit 32 locks the tracked divided phase when tracking and determining that the divided phase falls within the fine phase range.

The coarse locking circuit 31 and the fine locking circuit 32 output the coarse locking signal Clocked and the fine locking signal Flocked to the encoder 33 respectively, according to the tracking and locking results. The encoder 33 encodes the coarse locking signal Clocked and the fine locking circuit Flocked to output the corresponding lock control signal Ctrlok to the oscillator circuit 40. Finally, the oscillator circuit 40 may output another oscillator signal according to the lock control signal Ctrlok (and the initial calibration signal Tinit).

Figure 3:
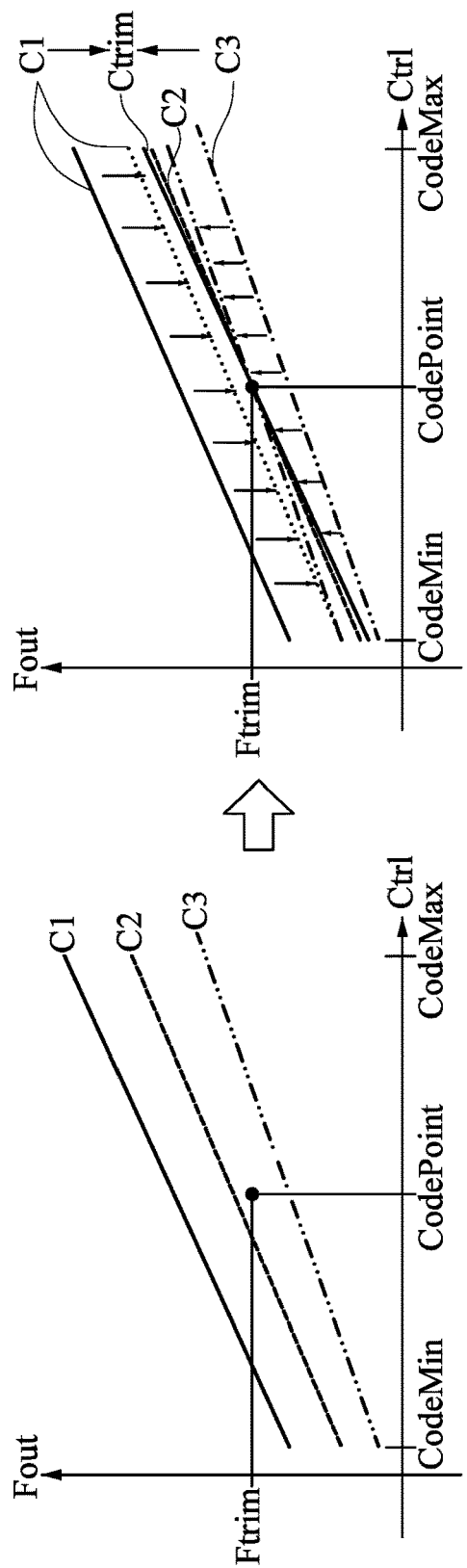
FIG. 3 is a curve diagram illustrating curves of an oscillating frequency verse an initial control signal of a digital phase-locked loop with an automatic calibration function according to a third embodiment of the present disclosure.

Referring to FIG. 3, a curve diagram illustrating curves of an oscillating frequency verse an initial control signal of a digital phase-locked loop with an automatic calibration function according to a third embodiment of the present disclosure is shown. As shown in FIG. 3, a vertical axis represents the oscillation frequency Fout and a horizontal axis represents the initial control signal Ctrl.

The calibration circuit 20 may store a lookup table, which may have a plurality of codes such as a minimum code CodeMin, a maximum code CodeMax, and a default code CodePoint between the minimum code CodeMin and the maximum code CodeMax, as shown in FIG. 3. In addition, the lookup table may have a plurality of preset frequencies respectively corresponding to the plurality of codes for calibration of the initial frequency of the initial control signal Ctrl. A curve Ctrim shown in FIG. 3 represents that the different codes correspond to the different preset frequencies respectively, wherein the default code CodePoint corresponds to the preset frequency Ftrim. It is understandable that a code is proportional to the frequency with reference to a positive slope of the curve Ctrim shown in FIG. 3 in the embodiment, and vice versa.

The calibration circuit may look up one of the codes corresponding to the preset frequency Ftrim from the lookup table according to the preset frequency Ftrim indicated by the calibration control signal Cpc received by the frequency and phase locked circuit and obtain the corresponding allowable calibration error range. When the calibration circuit determines that the initial frequency falls within the obtained allowable calibration error range, the initial frequency is equal to an upper range value, a lower range value or a value between the upper range value and the lower range value of the allowable calibration error range. In this condition, the initial frequency does not need to be calibrated, as a curve C2 shown in FIG. 3.

Conversely, when the calibration circuit determines that the initial frequency does not fall within the obtained allowable calibration error range, for example, a curve C1 shown in FIG. 3 indicates that the initial frequency exceeds the allowable calibration error range, and a curve C3 indicates that the initial frequency is lower than the allowable calibration error range, the calibration circuit calibrates the initial frequency based on the obtained preset frequency. The initial frequency is calibrated into different frequencies when the different codes are obtained. For example, as shown in FIG. 3, the curve C1 and the curve C3 are calibrated into a curve Ctrim respectively.

Figure 4:
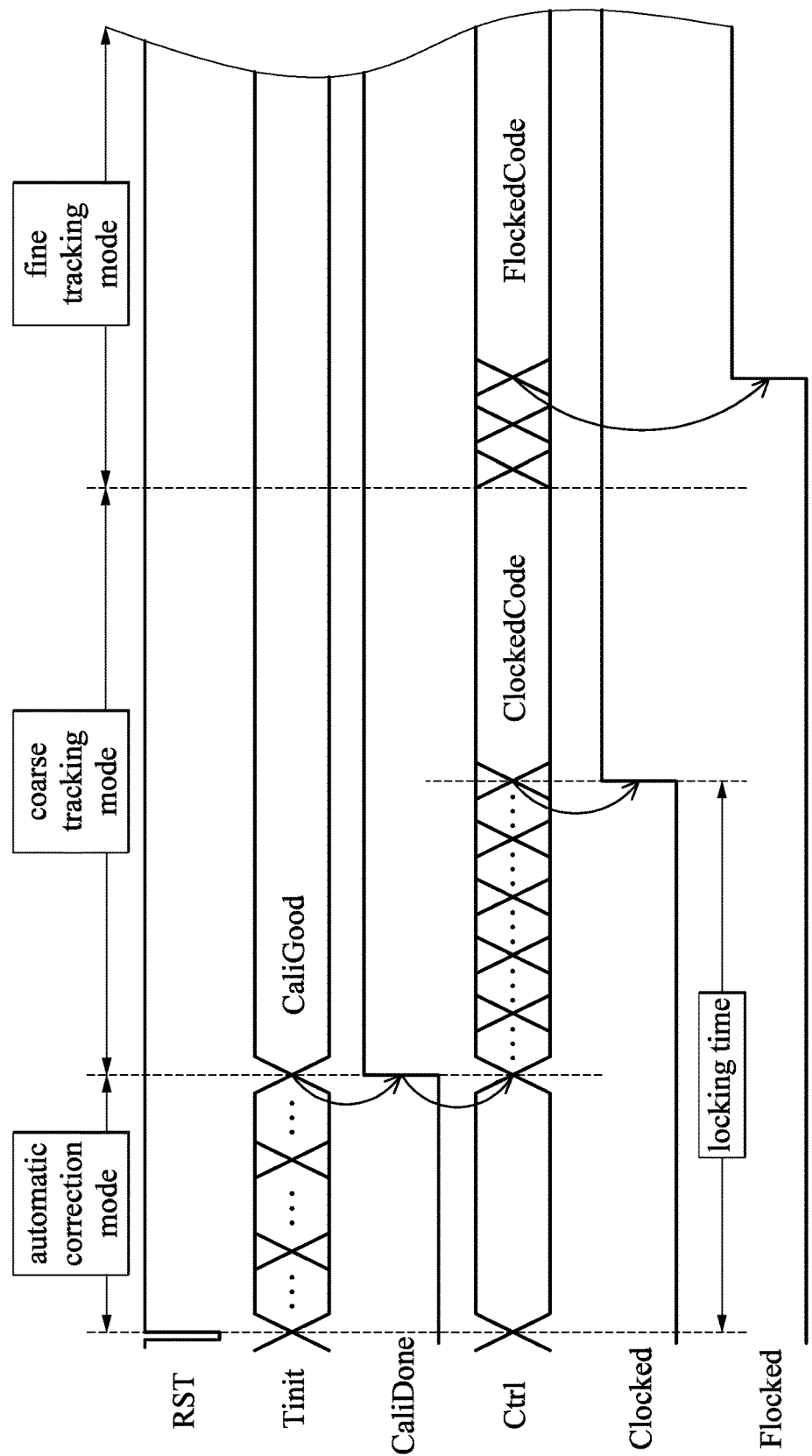
FIG. 4 is a schematic diagram of signals in an automatic calibration mode, a coarse tracking mode, and a fine tracking mode of a digital phase-locked loop with an automatic calibration function according to a fourth embodiment of the present disclosure.

Referring to FIG. 4, a schematic diagram of signals in an automatic calibration mode, a coarse tracking mode, and a fine tracking mode of a digital phase-locked loop with an automatic calibration function according to a fourth embodiment of the present disclosure is shown.

As shown in FIG. 4, the operation modes of the digital phase-locked loop mainly include the automatic calibration mode, the coarse tracking mode and the fine tracking mode. First, a reset signal RST is provided to reset the digital phase-locked loop when the digital phase-locked loop is activated. Then, the digital phase-locked loop enters the automatic calibration mode to calibrate the initial frequency of the initial control signal, and in practice, the oscillator signal may be further calibrated.

After the calibration circuit completes the calibration of the initial control signal, a calibration status indicating signal CaliDone transits from a low level to a high level as shown in FIG. 4. At this time, the calibration circuit outputs the initial calibration signal Tinit having a code CaliGood representing that the calibration has been completed.

Then, the digital phase-locked loop enters the coarse tracking mode, including a coarse tracking stage and a coarse locking stage. At the coarse tracking stage, the coarse locking circuit outputs the coarse locking signal Clocked at the low level. The coarse locking circuit performs the coarse tracking operation on the initial calibration frequency of the initial calibration signal Tinit outputted by the calibration circuit. The digital phase-locked loop enters the coarse locking stage until the tracked initial calibration frequency falls within the coarse locked frequency range. At this time, the coarse locking signal Clocked outputted by the coarse locking circuit transits from a low level to a high level to be outputted to the encoder.

After a period of coarse locking, the digital phase-locked loop enters the fine tracking mode, including a fine tracking stage and a fine locking stage. At the fine tracking stage, the fine locking circuit outputs the fine locking signal Flocked at the low level. The fine locking circuit performs the fine tracking operation on the initial calibration frequency of the initial calibration signal Tinit. The digital phase-locked loop enters the fine locking stage when the tracked initial calibration frequency falls within the fine locked frequency range. At this time, the fine locking signal Flocked outputted by the fine locking circuit transits from a low level to a high level to be outputted to the encoder.

Finally, the encoder encodes bits of the coarse locking signal Clocked and the fine locking signal Flocked to generate a lock control signal Ctrlok having a bit stream, including a coarse code ClockedCode representing the coarse locked frequency and a fine code FlockedCode representing the fine locked frequency.

Figure 5:
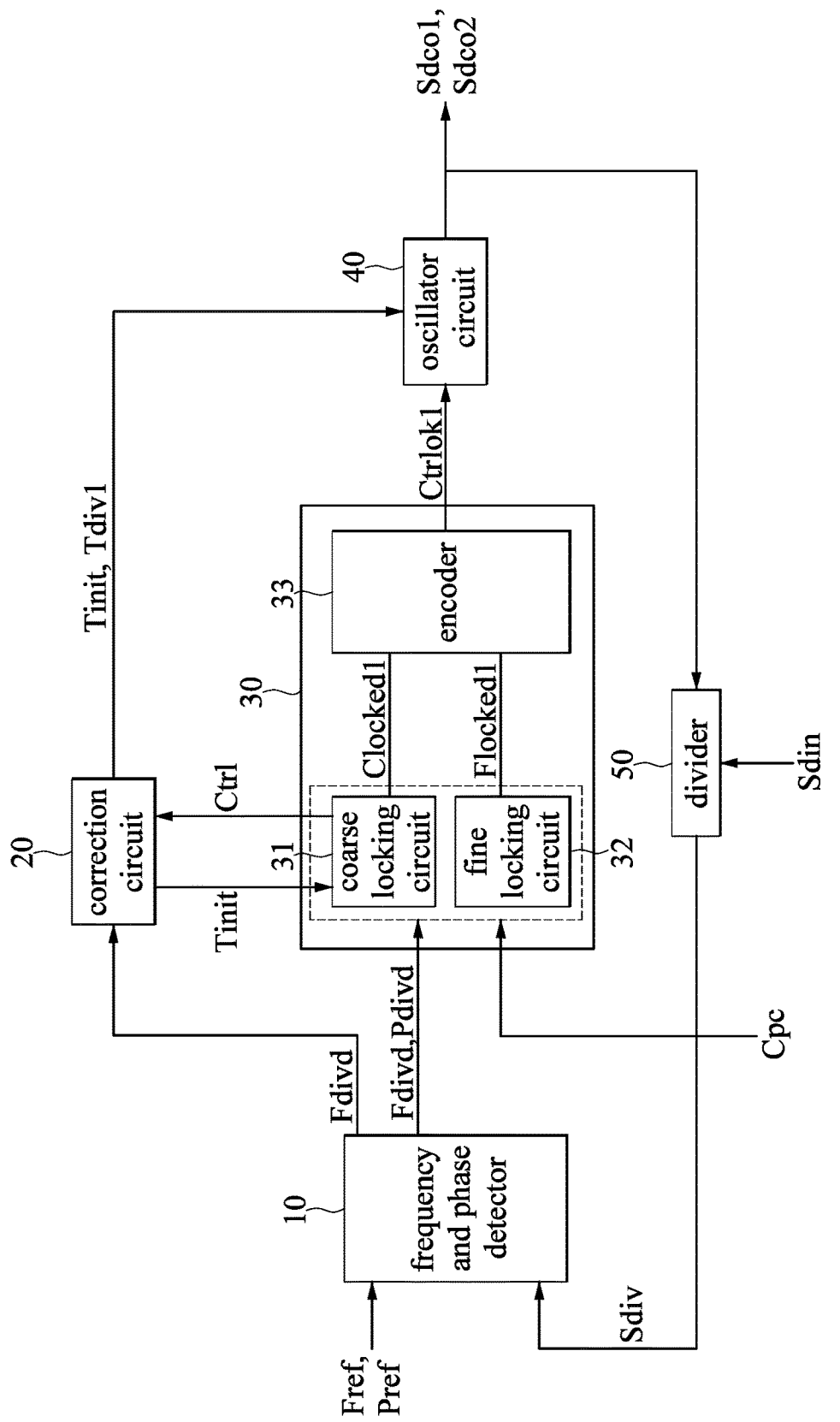
FIG. 5 is a block diagram of a digital phase-locked loop with an automatic calibration function for calibration of an initial frequency and an oscillating frequency according to a fifth embodiment of the present disclosure.

Referring to FIG. 5, a block diagram of a digital phase-locked loop with an automatic calibration function for calibration of an initial frequency and an oscillating frequency according to a fifth embodiment of the present disclosure is shown. As shown in FIG. 5, in the embodiment, in addition to the calibration of the initial frequency of the initial control signal Ctrl as in the above embodiment, the divided frequency of the divided signal may be further calibrated and the calibrated divided frequency may be locked. The frequency calibration of the divided signal will be described in detail below.

After the oscillator circuit 40 outputs the oscillator signal Sdco1 according to the initial control signal Ctrl and the divider 50 adjusts the oscillating frequency of the oscillator signal Sdco1 to output the divided signal Sdiv to the frequency and phase detector 10, the frequency and phase detector 10 may detect the frequency difference Fdivd between the divided frequency of the divided signal Sdiv and the reference frequency Fref and output the frequency difference Fdivd. The calibration circuit 20 receives the frequency difference Fdivd. Accordingly, when the divided frequency of the divided signal Sdiv does not fall within the allowable calibration error range, the calibrated divided frequency is calibrated so as to output a divided calibration signal Tdiv1 having the calibrated division frequency.

The coarse locking circuit 31 and the fine locking circuit 32 receive the coarse locked frequency range and the fine locked frequency range respectively. The coarse locking circuit 31 outputs a coarse locking signal Clocked1 when the calibrated divided frequency of the divided calibration signal Tdiv1 falls within the coarse locked frequency range. The fine locking circuit 32 outputs a fine locking signal Flocked1 when the calibrated divided frequency of the divided calibration signal Tdiv1 falls within the fine locked frequency range. The encoder 33 encodes the fine locking signal Clocked1 and the divided calibration signal Tdiv1 to output a lock control signal Ctrlok1.

Finally, the oscillator circuit 40 outputs another oscillator signal Sdco2 according to the lock control signal Ctrlok1 and the divided calibration signal Tdiv1. The divided frequencies of the divided signals formed from the other oscillator signal Sdco2 and any subsequently generated oscillator signals may be subjected to calibration, tracking and locking operations with reference to the above description.

Figure 6:
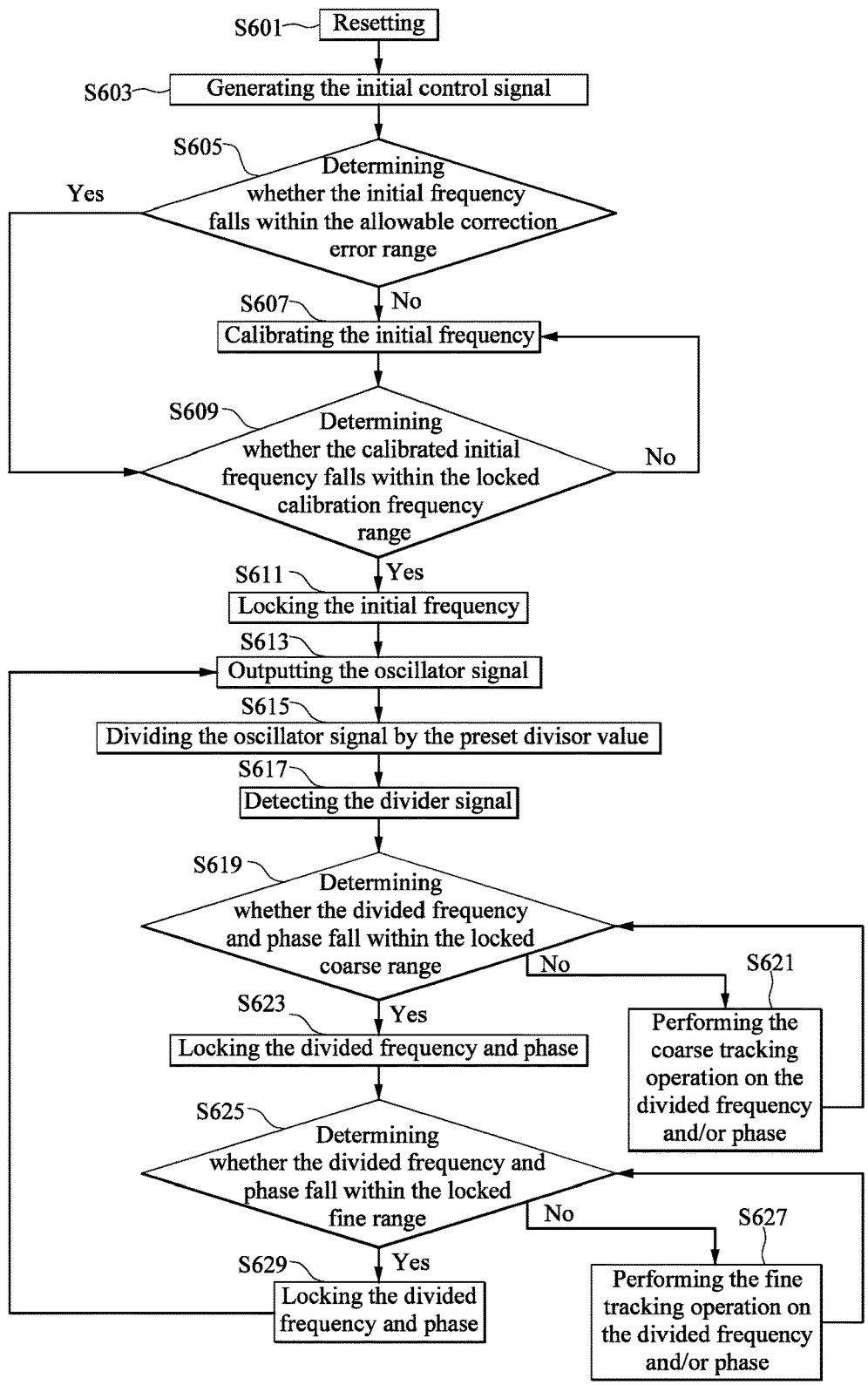
FIG. 6 is a flowchart of an automatic calibration method for a digital phase-locked loop with an automatic calibration function that includes a step of performing an initial frequency calibration according to a sixth embodiment of the present disclosure.

Referring to FIG. 6, a flowchart of an automatic calibration method for a digital phase-locked loop with an automatic calibration function that includes a step of performing an initial frequency calibration according to a sixth embodiment of the present disclosure is shown. As shown in FIG. 6, the automatic calibration method for the above digital phase-locked loop may include the following steps S601 to S629.

In step S601, the digital phase-locked loop is reset.

In step S603, the frequency and phase-locked circuit receives the calibration control signal from an external electronic device and outputs the corresponding initial control signal.

In step S605, the calibration circuit tracks and determines whether the initial frequency of the initial control signal falls within the allowable calibration error range. In step S607, if the initial frequency does not fall within the allowable calibration error range, the calibration circuit calibrates the initial frequency to generate the calibrated initial frequency falling within the allowable calibration error range and outputs the initial calibration signal having the calibrated initial frequency. Next, step S609 is performed. Conversely, if the initial frequency falls within the allowable calibration error range, step S609 is performed without calibration.

In step S609, the coarse locking circuit determines whether the calibrated initial frequency of the initial calibration signal falls within the locked calibration frequency range. Alternatively, if the calibration operation is not performed, the coarse locking circuit determines whether the initial frequency of the initial control signal falls within the locked calibration frequency range. The above locked calibration frequency range may be replaced with the following coarse locked frequency range applied to the divided frequency. If the calibrated initial frequency or the initial frequency does not fall within the locked calibration frequency range, step S607 is performed again. If the calibrated initial frequency or the initial frequency falls within the locked calibration frequency range, the coarse locking circuit locks the tracked initial frequency or calibrated initial frequency, and then step S613 is performed. The above locked calibration frequency range may have larger or the same values as compared to the coarse locked frequency range applied for the divided frequency.

Optionally, in the embodiment, the automatic calibration method further includes the following steps: tracking whether the initial phase of the initial control signal falls within the locked phase range by the frequency and phase locked circuit. If the initial phase of the initial control signal does not fall within the locked phase range, this step is performed again. Conversely, if the initial phase of the initial control signal falls within the locked phase range, the initial phase frequency is locked by the phase locked circuit and then step S613 is performed.

In step S613, if the initial frequency is calibrated, the oscillator circuit outputs the oscillator signal according to the initial calibration signal and the initial control signal. Conversely, if the initial frequency is not calibrated, the oscillator circuit outputs the oscillator signal according to the initial control signal.

In step S615, the divider divides the oscillation frequency of the oscillator signal by the preset divisor value to output the divided signal having the divided frequency.

In step S617, the frequency and phase detector detects the frequency difference between the divided frequency of the divided signal and the reference frequency, and the phase difference between the divided phase of the divided signal and the reference phase.

In step S619, the frequency and phase locked circuit tracks and determines whether the divided frequency falls within the coarse locked frequency range according to the frequency difference, and the divided phase falls within the coarse locked phase range according to the phase difference.

If the divided frequency does not fall within the coarse locked frequency range, the coarse tracking operation is performed on the divided frequency in step S621. On the other hand, if the divided phase does not fall within the coarse locked phase range, a coarse tracking operation is performed on the divided phase in step S621. Conversely, if the divided frequency falls within the coarse locked frequency range, the tracked divided frequency is locked in step S623. On the other hand, if the divided phase falls within the coarse locked phase range, the tracked divided phase is locked in step S623. Alternatively, the frequency may be tracked and locked in steps S621 to S623 and the phase is started to be tracked and locked in steps S625 to S629.

In step S625, the fine locking circuit tracks and determines whether the divided frequency falls within the fine locked frequency range according the frequency difference, and the divided phase falls within the fine locked phase range according the phase difference. In step S627, if the divided frequency does not fall within the fine locked frequency range, a fine tracking operation is performed on the divided frequency. On the other hand, if the divided phase does not fall within the fine locked phase range, a fine tracking operation is performed on the divided phase in step S627. Conversely, if the divided frequency falls within the fine locked frequency range, the tracked divided frequency is locked in step S629. On the other hand, if the divided phase falls within the fine locked phase range, the tracked divided phase is locked in step S629. After the frequency and the phase are locked, the oscillator circuit accordingly outputs another oscillator signal, and then steps S615 to S629 are performed for the other oscillator signal.

In addition, the automatic calibration method includes the following steps: outputting the coarse locking signal and the fine locking signal according to the coarse tracking result and the fine tracking result from the fine locking circuit and coarse locking circuit respectively; encoding the coarse locking signal and the fine locking signal to output the lock control signal having the bit stream by the encoder; outputting another oscillator signal according to the lock control signal and the initial calibration signal by the oscillator circuit.

Figure 7:
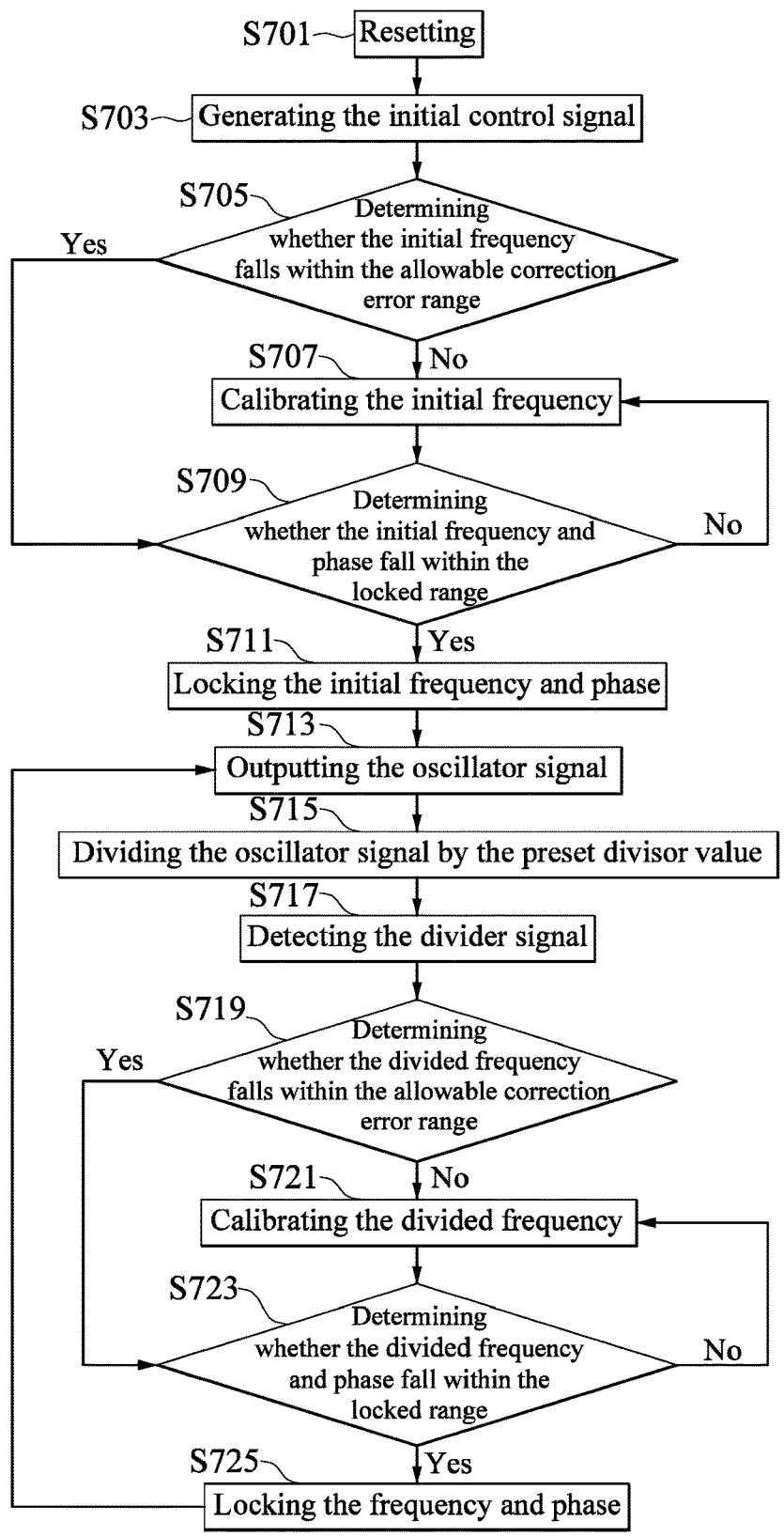
FIG. 7 is a flowchart of an automatic calibration method for a digital phase-locked loop with an automatic calibration function that includes a step of performing calibration of an initial frequency and an oscillating frequency according to a seventh embodiment of the present disclosure.

Referring to FIG. 7, a flowchart of an automatic calibration method for a digital phase-locked loop with an automatic calibration function that includes a step of performing calibration of an initial frequency and an oscillating frequency according to a seventh embodiment of the present disclosure is shown. As shown in FIG. 7, the automatic calibration method for the above digital phase-locked loop with the automatic calibration function includes the following steps S701 to S725.

In step S701, the digital phase-locked loop is reset.

In step S703, the frequency and phase locked circuit receives the calibration control signal from an external electronic device and output a corresponding initial control signal.

In step S705, the calibration circuit determines whether the initial frequency of the initial control signal falls within the allowable calibration error range. In step S707, if the initial frequency does not fall within the allowable calibration error range, the calibration circuit calibrates the initial frequency, and then step S709 is performed. If the initial frequency falls within the allowable calibration error range, step S709 is performed.

In step S709, when the initial frequency is calibrated, the coarse locking circuit tracks and determines whether the calibrated initial frequency falls within the coarse locked frequency range. Alternatively, when the initial frequency is not calibrated, the coarse locking circuit tracks and determines whether the initial frequency falls within the coarse locked frequency range. If the tracked initial frequency or calibrated initial frequency does not fall within the coarse locked frequency range, the coarse locking circuit continues to track the tracked initial frequency or the calibrated initial frequency.

In step S711, the coarse locking circuit locks the tracked initial frequency or calibrated initial frequency.

Optionally, the automatic calibration method may further include the following steps: tracking whether the initial phase of the initial control signal falls within the locked phase range. If the initial phase does not fall within the locked phase range, this step of tracking the initial phase is performed again. Conversely, if the initial phase falls within the locked phase range, the initial phase is locked, and then step S713 is performed.

In step S713, when the initial control signal is calibrated, the oscillator circuit outputs the oscillator signal according to the initial control signal and the initial calibration signal. Alternatively, when the initial control signal is not calibrated, the oscillator circuit outputs the oscillator signal according to the initial control signal.

In step S715, the divider divides the oscillator signal by the preset divisor value to output the corresponding divided signal.

In step S717, the frequency and phase detector detects divided frequency difference between the divided frequency of the divided signal and the reference frequency.

In step S719, the calibration circuit determines whether the divided frequency falls within the allowable calibration error range according to the divided frequency difference. If the divided frequency does not fall within the allowable calibration error range, the calibration circuit calibrates the divided frequency based on the preset frequency and outputs the divided calibration signal having the calibrated divided frequency in step S721, and then step S723 is performed. Conversely, if the divided frequency falls within the allowable calibration error range, step S723 is performed.

In step S723, when the divided frequency is calibrated, the frequency and phase locked circuit tracks and determines whether the calibrated divided frequency of the divided calibration signal falls within the locked frequency range. Alternatively, when the divided frequency is not calibrated, the frequency and phase locked circuit tracks and determines whether the divided frequency of the divided signal falls within the locked frequency range. On the other hand, the frequency and phase locked circuit tracks and determines whether the divided phase of the divided signal falls within the locked phase range.

In step S725, if the calibrated divided frequency or the divided frequency does not fall within the locked frequency range, the frequency and phase locked circuit continues to track the calibrated divided frequency or the divided frequency. On the other hand, if the divided phase does not fall within the locked phase range, the frequency and phase locked circuit continues to track the divided phase in step S725. Conversely, if the calibrated divided frequency or the divided frequency falls within the locked frequency range, the frequency and phase locked circuit locks the tracked divided frequency or calibrated divided frequency. On the other hand, if the divided phase falls within the locked phase range, the frequency and phase locked circuit locks the tracked divided phase, and outputs the lock control signal according to the frequency and phase tracking result. Finally, the oscillator circuit outputs another oscillator signal according to the lock control signal and the divided calibration signal, and then steps S715 to S725 are performed for another oscillator signal.

The calibration frequency range may include the coarse locked frequency range and the fine locked frequency range. The calibration phase range may include the coarse locked phase range and the fine locked phase range. That is, steps S619 to S629 of the sixth embodiment applied to the divided frequency and the divided phase may be used for the calibrated divided frequency (produced after the divided frequency is calibrated) and the divided phase. For example, the frequency and phase locked circuit locks the calibrated divided frequency falling within the coarse locked frequency range or the fine locked frequency range, and locks the calibrated divided phase falling within the coarse locked phase range or the fine locked phase range.

In summary, the digital phase-locked loop with an automatic calibration function and the automatic calibration method provided by the present application can automatically calibrate the frequency drift without using an additional machine for calibration when the frequency of the output of the oscillator circuit is drifted due to various factors in the process and in the environment, such as when the digital phase-locked loop is activated. Furthermore, as the number of bits of the oscillator circuit is limited, a resolution of the oscillator can be optimized and costs can be effectively saved thereby.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A digital phase-locked loop with an automatic calibration function comprising:
   a frequency and phase locked circuit configured to receive a calibration control signal from an external electronic device and output a corresponding initial control signal, wherein the frequency and phase locked circuit is configured to track a calibrated initial frequency and an initial phase of an initial calibration signal, and lock the calibrated initial frequency and the initial phase when the calibrated initial frequency falls within a locked calibration frequency range and the initial phase falls within a locked phase range, the frequency and phase locked circuit is configured to lock a divided frequency and a divided phase of a divided signal when determining that the divided frequency falls within a locked frequency range and the divided phase falls within the locked phase range;
   a calibration circuit connected to the frequency and phase locked circuit, the calibration circuit being configured to store an allowable calibration error range, and calibrate the initial frequency to generate the calibrated initial frequency and output the initial calibration signal having the calibrated initial frequency when determining that an initial frequency of the initial control signal does not fall within the allowable calibration error range;
   an oscillator circuit connected to the calibration circuit and the frequency and phase locked circuit, the oscillator circuit being configured to output an oscillator signal according to the initial calibration signal and the initial control signal;
   a divider connected to the oscillator circuit and configured to receive a divisor instructing signal indicating a preset divisor value from an external electronic device, the divider being further configured to divide an oscillation frequency of the oscillator signal by the preset divisor value to generate the divided signal, the preset divisor value being associated with a ratio of a reference frequency and the oscillating frequency; and
   a frequency and phase detector connected to the divider, the frequency and phase detector being configured to detect a frequency difference between the divided frequency and the reference frequency and a phase difference between the divided phase and a reference phase, and being configured to output the frequency difference and the phase difference to the frequency and phase locked circuit as a basis for determining that the divided frequency falls within the locked frequency range and the divided phase falls within the locked phase range.

2. The digital phase-locked loop of claim 1, wherein the locked frequency range includes a coarse locked frequency range and a fine locked frequency range, the locked phase range includes a coarse locked phase range and a fine locked phase range, the frequency and phase-locked circuit including:
   a coarse locking circuit connected to the frequency and phase detector and the oscillator circuit, wherein the coarse locking circuit is configured to store the coarse locked frequency range and the coarse locked phase range, the coarse locking circuit is configured to lock the calibrated initial frequency or the divided frequency when tracking that the calibrated initial frequency or the divided frequency falls within the coarse locked frequency range, lock the initial phase or the divided phase when tracking that the initial phase or the divided phase falls within the coarse locked phase range, and output a corresponding coarse locking signal; and
   a fine locking circuit connected to the frequency and phase detector and the oscillator circuit, wherein the fine locking circuit is configured to store the fine locked phase range and the fine locked phase range, the fine locking circuit is configured to lock the calibrated initial frequency or the divided frequency when tracking that the calibrated initial frequency or the divided frequency falls within the fine locked frequency range, and the fine locking circuit is configured to lock the initial calibration phase or the divided phase when tracking that the initial calibration phase or the divided phase falls within the fine locked phase range, and output a corresponding fine locking signal.

3. The digital phase-locked loop of claim 2, further comprising: an encoder connected to the coarse locking circuit, the fine locking circuit and the oscillator circuit, wherein the encoder is configured to encode the coarse locking signal and the fine locking signal to output a lock control signal to the oscillator circuit, the oscillator circuit is configured to output another oscillator signal according to the lock control signal.

4. The digital phase-locked loop of claim 1, wherein the frequency and phase detector is configured to detect a divided frequency difference between the divided frequency of the divided signal and the reference frequency;
   the calibration circuit is configured to calibrate the divided frequency when determining that the divided frequency does not fall within the allowable calibration error range according to the divided frequency difference, and output a divided calibration signal including a calibrated divided frequency;
   the frequency and phase locked circuit is configured to lock the calibrated divided frequency and output a corresponding lock control signal when determining that the calibrated divided frequency falls within the locked frequency range;

the oscillator circuit is configured to output another oscillator signal according to the lock control signal and the divided calibration signal.

5. An automatic calibration method for a digital phase-locked loop with an automatic calibration function, comprising the following steps:

(a) outputting an initial control signal from a frequency and phase locked circuit;

(b) calibrating an initial frequency to generate an calibrated initial frequency and outputting an initial calibration signal having the calibrated initial frequency by a calibration circuit when determining that the initial frequency of the initial control signal does not fall within an allowable calibration error range by the calibration circuit;

(c) tracking whether the calibrated initial frequency falls within a locked calibration frequency range or not by the frequency and phase locked circuit; when the calibrated initial frequency does not fall within the locked calibration frequency range, performing step (b);

when the calibrated initial frequency falls within the locked calibration frequency range, locking the calibrated initial frequency by the frequency and phase locked circuit and then performing step (d);

(d) outputting an oscillator signal according to the initial calibration signal and the initial control signal by an oscillator circuit;

(e) dividing an oscillation frequency of the oscillator signal by a preset divisor value to generate a divided signal by a divider;

(f) detecting a frequency difference between a divided frequency of the divided signal and a reference frequency, and a phase difference between a divided phase of the divided signal and a reference phase by the frequency and phase detector;

(g) tracking whether the divided frequency falls within a locked frequency range according to the frequency difference or not by the frequency and phase locked circuit; when the divided frequency does not fall within the locked frequency range, continuing to track the divided frequency; when the divided frequency falls within the locked frequency range, locking the divided frequency by the frequency and phase locked circuit and then performing step (h);

(h) tracking whether the divided phase falls within a locked phase range according to the phase difference or not by the frequency and phase locked circuit; when the divided phase does not fall within the locked phase range, continuing to track the divided phase; when the divided phase falls within the locked phase range, locking the divided phase by the frequency and phase locked circuit and then performing step (d).

6. The automatic calibration method of claim 5, after step (c) of tracking that the calibrated initial frequency falls within the locked calibration frequency range, further comprising a step of:

tracking whether an initial phase of the initial control signal falls within the locked phase range or not by the frequency and phase locked circuit; when the initial phase does not fall within the locked phase range, continuing to track the initial phase; when the initial phase falls within the locked phase range, locking the initial phase by the frequency and phase locked circuit and then performing step (d).

7. The automatic calibration method of claim 5, further comprising steps of:

tracking whether the calibrated initial frequency falls within a coarse locked frequency range or not by a coarse locking circuit; when the calibrated initial frequency does not fall within the coarse locked frequency range, continuing to track the calibrated initial frequency; when the calibrated initial frequency falls within the coarse locked frequency range, locking the calibrated initial frequency by the coarse locking circuit and then performing the next step;

tracking whether the divided frequency falls within the coarse locked frequency range or not by the coarse locking circuit; when the divided frequency does not fall within the coarse locked frequency range, continuing to track the divided frequency; when the divided frequency falls within the coarse locked frequency range, locking the tracked divided frequency and outputting a corresponding coarse locking signal to the oscillator circuit by the coarse locking circuit; and tracking whether the divided frequency falls within the fine locked frequency range or not by a fine locking circuit; when the divided frequency does not fall within the fine locked frequency range, continuing to track the divided frequency; when the divided frequency falls within the fine locked frequency range, locking the divided frequency and outputting a corresponding fine locking signal to the oscillator circuit by the fine locking circuit.

8. The automatic calibration method of claim 7, after the step of tracking that the calibrated initial frequency falls within the coarse locked frequency range by the coarse locking circuit, further including a step of:

tracking whether the calibrated initial frequency falls within the fine locked frequency range or not by the fine locking circuit; when the calibrated initial frequency does not fall within the fine locked frequency range, continuing to track the calibrated initial frequency; when the calibrated initial frequency falls within the fine locked frequency range, locking the calibrated initial frequency and outputting a corresponding fine locking signal to the oscillator circuit by the fine locking circuit.

9. The automatic calibration method of claim 5, further comprising steps of:

tracking whether the initial phase falls within a coarse locked phase range or not by a coarse locking circuit; when the initial phase does not fall within the coarse locked phase range, continuing to track the initial phase; when the initial phase falls within the coarse locked phase range, locking the initial phase by the coarse locking circuit and then performing the next step;

tracking whether the divided phase falls within the coarse locked phase range or not by the coarse locking circuit; when the divided phase does not fall within the coarse locked phase range, continuing to track the divided phase; when the divided phase falls within the coarse locked phase range, locking the divided phase and outputting a corresponding coarse locking signal to the oscillator circuit by the coarse locking circuit; and tracking whether the divided phase falls within the fine locked phase range or not by a fine locking circuit; when the divided phase does not fall within the fine locked phase range, continuing to track the divided phase; when the divided phase falls within the fine locked phase range, locking the divided phase and outputting a corresponding fine locking signal to the oscillator circuit by the fine locking circuit.

10. The automatic calibration method of claim 9, after the step of tracking that the initial phase falls within the coarse locked phase range by the coarse locking circuit, further comprising a step of:

tracking whether the initial phase falls within the fine locked phase range or not by the fine locking circuit; when the initial phase does not fall within the fine locked phase range, continuing to track the initial phase; when the initial phase falls within the fine locked phase range, locking the initial phase and outputting a corresponding fine locking signal to the oscillator circuit by the fine locking circuit.

11. The automatic calibration method of claim 7, before the step of outputting the coarse locking signal and fine locking signal to the oscillator circuit, further comprising steps of:

encoding the coarse locking signal and the fine locking signal to output a lock control signal to the oscillator circuit by a encoder; and outputting another oscillator signal according to the lock control signal and the initial calibration signal by the oscillator circuit.

12. The automatic calibration method of claim 5, further comprising steps of:

detecting a divided frequency difference between the divided frequency of the divided signal and the reference frequency by the frequency and phase detector;

calibrating the divided frequency when determining that the divided frequency does not fall within the allowable calibration error range according to the received divided frequency difference, and outputting a divided calibration signal including a calibrated divided frequency;

locking the calibrated divided frequency and outputting a corresponding lock control signal when determining that the calibrated divided frequency falls within the locked frequency range by the frequency and phase locked circuit; and outputting another oscillator signal according to the lock control signal and the divided calibration signal by the oscillator circuit.

\* \* \* \* \*